United States Patent
Huang et al.

(10) Patent No.: US 12,512,393 B2
(45) Date of Patent: Dec. 30, 2025

(54) LEADFRAME

(71) Applicant: Diodes Incorporated, Plano, TX (US)

(72) Inventors: Li-Ju Huang, Plano, TX (US); Michael Yimin Zhang, Dallas, TX (US)

(73) Assignee: DIODES INCORPORATED, Plano, TX (US)

( * ) Notice: Subject to any disclaimer, the term of this patent is extended or adjusted under 35 U.S.C. 154(b) by 474 days.

(21) Appl. No.: 17/803,180

(22) Filed: Aug. 31, 2022

(65) Prior Publication Data

US 2023/0317567 A1 Oct. 5, 2023

Related U.S. Application Data

(60) Continuation-in-part of application No. 29/813,450, filed on Oct. 28, 2021, now Pat. No. Des. 969,763, which is a division of application No. 29/692,906, filed on May 29, 2019, now Pat. No. Des. 939,458, application No. 17/803,180, filed on Aug. 31, 2022 is a continuation-in-part of application No. 29/813,451, filed on Oct. 28, 2021, now Pat. No. Des. 969,764, which is a division of application No. 29/692,906, filed on May 29, 2019, now Pat. No. Des. 939,458, application No. 17/803,180, filed on Aug. 31, 2022 is a continuation-in-part of application No. 29/813,452, filed on Oct. 28, 2021, now Pat. No. Des. 985,518, (Continued)

(51) Int. Cl.
*H01L 23/495* (2006.01)
*H01L 21/48* (2006.01)
*H01L 23/00* (2006.01)
*H01L 25/065* (2023.01)

(52) U.S. Cl.
CPC .... *H01L 23/49503* (2013.01); *H01L 21/4842* (2013.01); *H01L 23/49575* (2013.01); *H01L 24/06* (2013.01); *H01L 24/48* (2013.01); *H01L 24/49* (2013.01); *H01L 25/0655* (2013.01); *H01L 2224/0615* (2013.01); *H01L 2224/48108* (2013.01); *H01L 2224/48245* (2013.01); *H01L 2224/49113* (2013.01); *H01L 2224/49171* (2013.01)

(58) Field of Classification Search
CPC .................................................. H01L 23/49503
See application file for complete search history.

(56) References Cited

U.S. PATENT DOCUMENTS 3,864,884 A 2/1975 Weissman
3,900,759 A 8/1975 Fujisawa
(Continued)

*Primary Examiner* — Yu-Hsi D Sun
(74) *Attorney, Agent, or Firm* — Kilpatrick Townsend & Stockton LLP

(57) ABSTRACT

A leadframe includes a peripheral frame, a plurality of lead pads, and a die attach pad (DAP). Each lead pad is physically connected to the peripheral frame by a respective connecting portion. The DAP is surrounded by the plurality of lead pads. The DAP includes a first protruding portion coupled to a first lead pad on a first side of the DAP and a second protruding portion coupled to a second lead pad on a second side of the DAP opposite the first side. The DAP does not comprise direct connections to the peripheral frame. The leadframe further includes two or more of the lead pads disposed on either side of the first lead pad on the first side of the DAP; and two or more of the lead pads disposed on either side of the second lead pad on the second side of the DAP.

18 Claims, 18 Drawing Sheets

Related U.S. Application Data which is a division of application No. 29/692,906, filed on May 29, 2019, now Pat. No. Des. 939,458, application No. 17/803,180, filed on Aug. 31, 2022 is a continuation-in-part of application No. 29/814,007, filed on Nov. 2, 2021, now Pat. No. Des. 980,811, which is a division of application No. 29/699,936, filed on Jul. 30, 2019, now Pat. No. Des. 940,090, which is a continuation-in-part of application No. 29/692,906, filed on May 29, 2019, now Pat. No. Des. 939,458, application No. 17/803,180, filed on Aug. 31, 2022 is a continuation-in-part of application No. 29/814,008, filed on Nov. 2, 2021, now abandoned, which is a division of application No. 29/699,936, filed on Jul. 30, 2019, now Pat. No. Des. 940,090, application No. 17/803,180, filed on Aug. 31, 2022 is a continuation-in-part of application No. 29/814,009, filed on Nov. 2, 2021, now Pat. No. Des. 969,903, which is a division of application No. 29/699,936, filed on Jul. 30, 2019, now Pat. No. Des. 940,090.

(56) References Cited

U.S. PATENT DOCUMENTS

| | | |
|---|---|---|
| 3,906,273 A | 9/1975 | Kozlowski |
| 3,939,458 A | 2/1976 | Kuntze |
| 3,940,090 A | 2/1976 | Pembroke |
| 10,128,171 B1 | 11/2018 | Kao et al. |
| 10,347,571 B1 | 7/2019 | Rozbicki et al. |
| D864,884 S | 10/2019 | Yoneyama et al. |
| D900,759 S | 11/2020 | Majima et al. |
| D906,273 S | 12/2020 | Majima et al. |
| D939,458 S | 12/2021 | Huang et al. |
| D940,090 S | 1/2022 | Huang et al. |
| 2003/0127711 A1* | 7/2003 | Kawai .............. H01L 23/49503 257/691 |
| 2005/0258520 A1 | 11/2005 | Dolan |
| 2009/0278241 A1 | 11/2009 | Liu et al. |
| 2015/0084172 A1 | 3/2015 | Do et al. |
| 2015/0200156 A1 | 7/2015 | Weld et al. |
| 2015/0221584 A1 | 8/2015 | Lopez et al. |
| 2018/0130723 A1 | 5/2018 | Lin et al. |
| 2018/0182642 A1 | 6/2018 | Milo et al. |
| 2019/0198352 A1 | 6/2019 | Nangia et al. |
| 2019/0295934 A1 | 9/2019 | Crema |
| 2019/0355651 A1 | 11/2019 | Milo et al. |
| 2020/0035586 A1 | 1/2020 | Liong et al. |
| 2020/0194351 A1 | 6/2020 | Talledo |
| 2020/0194357 A1 | 6/2020 | Shibuya et al. |
| 2020/0211933 A1 | 7/2020 | Raposas et al. |
| 2020/0258825 A1 | 8/2020 | Tang et al. |
| 2020/0303609 A1 | 9/2020 | Yoon |
| 2020/0312754 A1 | 10/2020 | Yasuda et al. |
| 2020/0312958 A1 | 10/2020 | Murthy et al. |
| 2020/0343168 A1 | 10/2020 | Cadag et al. |
| 2020/0411421 A1 | 12/2020 | Teysseyre et al. |
| 2021/0020553 A1 | 1/2021 | Macheiner et al. |
| 2021/0090980 A1 | 3/2021 | Noquil et al. |
| 2021/0193541 A1 | 6/2021 | Moitzi |
| 2021/0225742 A1 | 7/2021 | Jhan et al. |
| 2022/0020680 A1 | 1/2022 | Huang et al. |
| 2022/0028767 A1 | 1/2022 | Anjum et al. |
| 2022/0102248 A1 | 3/2022 | Almagro et al. |
| 2022/0139812 A1 | 5/2022 | Huang et al. |

* cited by examiner

LEADFRAME

CROSS-REFERENCES TO RELATED APPLICATIONS

This application is a Continuation-in-part application of U.S. Design Patent application Ser. No. 29/813,450, entitled "LEADFRAME," filed on Oct. 28, 2021, which is a Division of U.S. Design Patent application Ser. No. 29/692,906, filed May 29, 2019, now U.S. Design Patent No. D939,458, commonly assigned, incorporated by reference in their entirety herein for all purposes.

This application is a Continuation-in-part application of U.S. Design Patent application Ser. No. 29/813,451, entitled "LEADFRAME," filed on Oct. 28, 2021, which is a Division of U.S. Design Patent application Ser. No. 29/692,906, filed May 29, 2019, now U.S. Design Patent No. D939,458, commonly assigned, incorporated by reference in their entirety herein for all purposes.

This application is a Continuation-in-part application of U.S. Design Patent application Ser. No. 29/813,452, entitled "LEADFRAME," filed on Oct. 28, 2021, which is a Division of U.S. Design Patent application No. 29/692,906, filed May 29, 2019, now U.S. Design Patent No. D939,458, commonly assigned, incorporated by reference in their entirety herein for all purposes.

This application is a Continuation-in-part application of U.S. Design Patent application Ser. No. 29/814,007, entitled "LEADFRAME," filed on Nov. 2, 2021, which is a Division of U.S. Design Patent application Ser. No. 29/699,936, filed Jul. 30, 2019, now U.S. Design Patent No. D940,090, which is a Continuation-in-part of U.S. Design Patent application Ser. No. 29/692,906, filed May 29, 2019, now U.S. Design Patent No. D939,458, commonly assigned, incorporated by reference in their entirety herein for all purposes.

This application is a Continuation-in-part application of U.S. Design Patent application Ser. No. 29/814,008, entitled "LEADFRAME," filed on Nov. 2, 2021, which is a Division of U.S. Design Patent application Ser. No. 29/699,936, filed Jul. 30, 2019, now U.S. Design Patent No. D940,090, which is a Continuation-in-part of U.S. Design Patent application Ser. No. 29/692,906, filed May 29, 2019, now U.S. Design Patent No. D939,458, commonly assigned, incorporated by reference in their entirety herein for all purposes.

This application is a Continuation-in-part application of U.S. Design Patent application Ser. No. 29/814,009, entitled "LEADFRAME," filed on 11-02-2021, which is a Division of U.S. Design Patent Application No. 29/699,936, filed Jul. 30, 2019, now U.S. Design Patent No. D940,090, which is a Continuation-in-part of U.S. Design Patent application Ser. No. 29/692,906, filed May 29, 2019, now U.S. Design Patent No. D939,458, commonly assigned, incorporated by reference in their entirety herein for all purposes.

BACKGROUND

This invention relates to the field of semiconductor device packaging. More particularly, the invention relates to leadframe design techniques for improving device performances.

A semiconductor package encloses an integrated circuit (IC) to form packaged integrated circuits. An integrated circuit die is typically attached to a die attach pad, a metal leadframe having leads physically isolated from the die attach pad, bond wires which electrically connect pads on the integrated circuit die to individual leads of the leadframe, and a hard encapsulant material which covers part or all of the package components, forming the exterior of the package, protects the integrated circuit from the environments, and leaves leads exposed, for electrical connection between the die and a printed circuit board.

In general, IC packages are either leaded or leadless. A leaded package has metal lead conductors that extend from the package for attaching to a printed circuit board. In contrast, a leadless package has exposed metal leads on one surface of the outside of the package. The exposed leads are substantially coplanar with the outside surface of the package and the leads are soldered to a printed circuit board. The leadless package has a lower profile than the leaded package and consumes less space on the support board. Thus, leadless packages are often used when space is a premium as in small systems such as cellular telephones, personal digital assistants, and laptop computers.

Even though leadless IC packages are in wide use, there is still a need for improved packaging technologies.

DEFINITIONS

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A semiconductor device chip or die in this paper refers to a slab of semiconductor material that contains an electronic component. In a discrete device, the chip may only contain a single circuit element such as a power transistor or a diode; in modern IC, a chip may contain over 10 billion circuit elements. Semiconductor material includes elements in Group IV on the periodic table, such as germanium, silicon, diamond, and compounds such as gallium arsenide, gallium nitride, silicon carbide, etc. Semiconductor chips are sawed from a finished semiconductor wafer; as such, they each have two opposite surfaces of major crystallographic planes, which are referred to in this paper as the top chip surface and the bottom surface.

When the phrase "the same" is used to describe two quantities, it means that the values of two quantities are determined the same within measurement or manufacturing limitations.

BRIEF SUMMARY

According to some embodiments, a leadframe includes a peripheral frame, a plurality of lead pads, and a die attach pad (DAP). Each lead pad is physically connected to the peripheral frame by a respective connecting portion. The DAP is surrounded by the plurality of lead pads. The DAP includes a first protruding portion coupled to a first lead pad on a first side of the DAP and a second protruding portion coupled to a second lead pad on a second side of the DAP opposite the first side. The DAP does not comprise direct connections to the peripheral frame. The leadframe further includes two or more of the lead pads disposed on either side of the first lead pad on the first side of the DAP; and two or more of the lead pads disposed on either side of the second lead pad on the second side of the DAP. In these embodiments, the first and second lead pads provide ground isolation and shielding for active signals to prevent interference and cross talk. Further, the die attach pad has no direct connection to the peripheral frame, simplifying the design and manufacturing of the leadframe.

According to some embodiments, a semiconductor package includes a leadframe. The leadframe has a die attach pad surrounded by a plurality of lead pads. The die attach pad is characterized by a rectangular shape and includes a first protruding portion on a first side of the die attach pad, the first protruding portion coupled to a first lead pad, and multiple lead pads on the first side of the die attach pad aligned with the first lead pad, with two or more of the lead pads disposed on both sides of the first lead pad. The die attach pad also includes a second protruding portion on a second side of the die attach pad opposite the first side, the second protruding portion coupled to a second lead pad; and multiple lead pads on the second side of the die attach pad aligned with the second lead pad, with two or more of the lead pads disposed on both sides of the second lead pad. The semiconductor package also includes a semiconductor integrated circuit (IC) die attached to the die attach pad of the leadframe, wherein the die attach pad provides electrical ground for the first lead pad and the second lead pad. The semiconductor package also includes bonding wires coupling bonding pads for active signals on the IC die to lead pads on the first side of the die attach pad that are not coupled to the die attach pad; and bonding wires coupling bonding pads for active signals on the IC die to lead pads on the second side of the die attach pad that are not coupled to the die attach pad.

In some embodiments of the above semiconductor package, the leadframe further comprises a peripheral frame connected to the plurality of lead pads, wherein the die attach pad does not comprise a direct connection to the peripheral frame.

According to some embodiments, a leadframe includes a peripheral frame, a plurality of lead pads, and a die attach pad. Each of the plurality of lead pads is physically connected to the peripheral frame by a respective connecting portion. The die attach pad is configured for mounting a semiconductor integrated circuit (IC) chip, the die attach pad being surrounded by the plurality of lead pads. The die attach pad is characterized by a rectangular shape and includes a first protruding portion on a first side of the die attach pad, and the first protruding portion coupled to a first lead pad. The die attach pad also includes a second protruding portion on a second side of the die attach pad opposite the first side, the second protruding portion coupled to a second lead pad. The die attach pad does not comprise direct connections to the peripheral frame. The leadframe further includes multiple lead pads on the first side of the die attach pad, with two or more of the lead pads disposed on either side of the first lead pad; and multiple lead pads on the second side of the die attach pad, with two or more of the lead pads disposed on either side of the second lead pad.

According to some embodiments, a method for forming a semiconductor package includes providing a leadframe. The leadframe includes a peripheral frame, a plurality of lead pads, each of the plurality of lead pads physically connected to the peripheral frame by a respective connecting portion, and a die attach pad configured for mounting a semiconductor integrated circuit (IC) chip. The die attach pad is surrounded by the plurality of lead pads. The die attach pad is characterized by a rectangular shape and includes a first protruding portion and a second protruding portion. The first protruding portion is located on a first side of the die attach pad, and the first protruding portion is coupled to a first lead pad. The second protruding portion is located on a second side of the die attach pad opposite the first side, and the second protruding portion is coupled to a second lead pad. The die attach pad does not comprise direct connections to the peripheral frame. The method for forming a semiconductor package also includes attaching a first semiconductor integrated circuit (IC) die to the die attach pad, bonding IC die bonding pads for active signals to lead pads on the first side of the die attach pad that are not coupled to the die attach pad, and bonding IC die bonding pads for active signals to lead pads on the second side of the die attach pad that are not coupled to the die attach pad. The method for forming a semiconductor package also includes applying a molding that covers portions of the leadframe, the die attach material, and the die, and separating the plurality of lead pads from the peripheral frame by cutting off the connecting portions between the lead pads and the peripheral frame.

DETAILED DESCRIPTION

Figure 1:
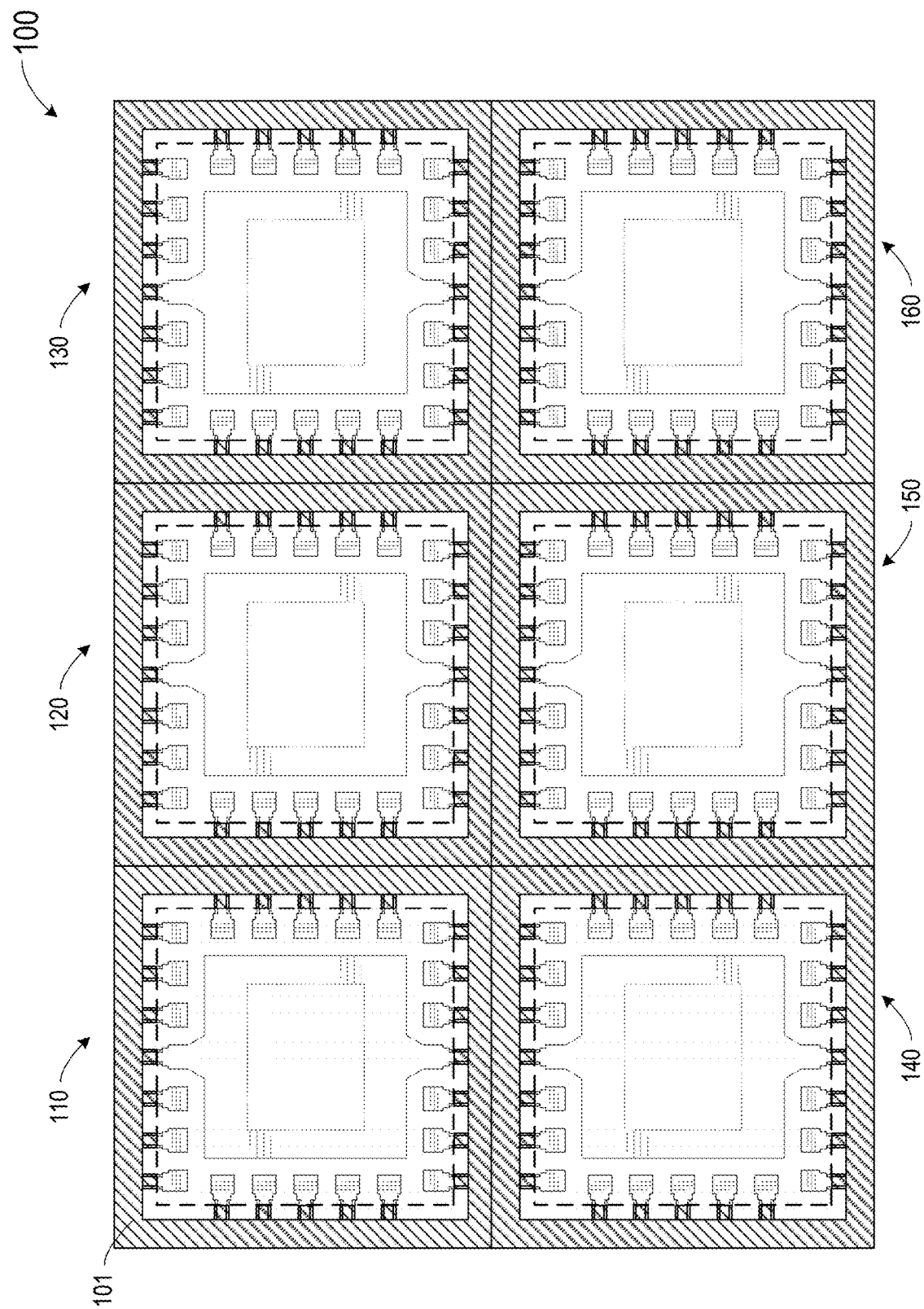
FIG. 1 is a simplified schematic diagram illustrating a top view of a leadframe array according to some embodiments of the invention.

FIG. 1 is a simplified schematic diagram illustrating a top view of a leadframe array according to some embodiments of the invention. As shown in FIG. 1, leadframe array 100 includes a plurality of leadframes 110, 120, 130, 140, 150, and 160, etc. Leadframe array 100 has a peripheral frame 101, shown as a shaded region, that holds all the leadframes together until they are singulated.

Figure 2:
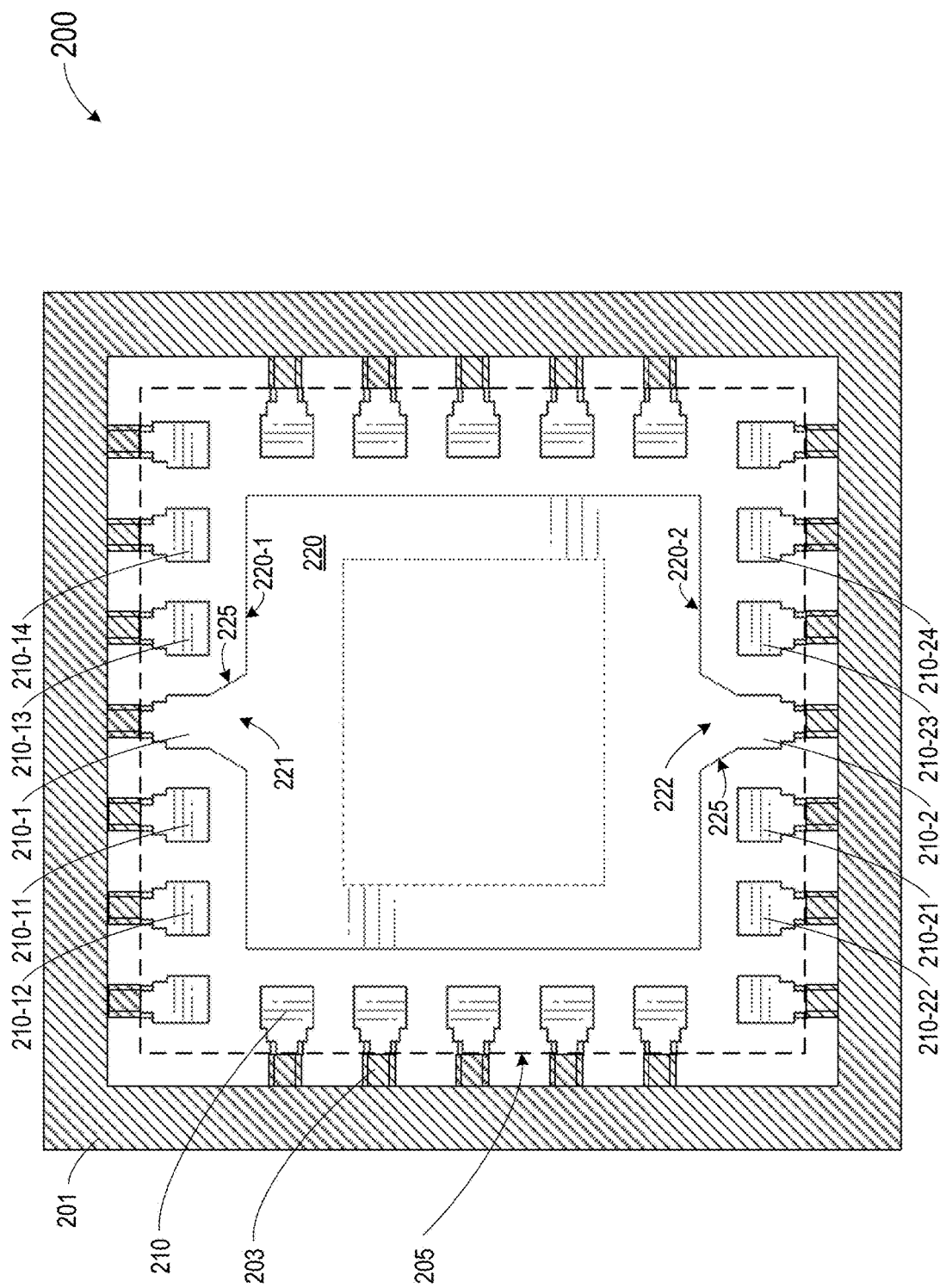
FIG. 2 is a simplified schematic diagram illustrating a top view of a leadframe according to some embodiments of the invention.

FIG. 2 is a simplified schematic diagram illustrating a top view of a leadframe according to some embodiments of the invention. As shown in FIG. 2, a leadframe 200 includes a peripheral frame and a plurality of lead pads 210. Each of the plurality of lead pads 210 is physically connected to the peripheral frame 201 by a respective connecting portion 203. Leadframe 200 also has a die attach pad 220 configured for mounting a semiconductor integrated circuit (IC) chip. The die attach pad 220 is surrounded by the plurality of lead pads 210. The die attach pad 220 is characterized by a rectangular shape. The die attach pad 220 includes a first protruding portion 221 on a first side 220-1 of the die attach pad 220 that is coupled to a first lead pad 210-1. The die attach pad 220 also includes a second protruding portion 222 on a second side 220-2 of the die attach pad 220 opposite the first side. The second protruding portion 222 is coupled to a second lead pad 210-2. Otherwise, the die attach pad 220 does not comprise direct connections to the peripheral frame 201, without going through a lead pad 210.

Figure 7:
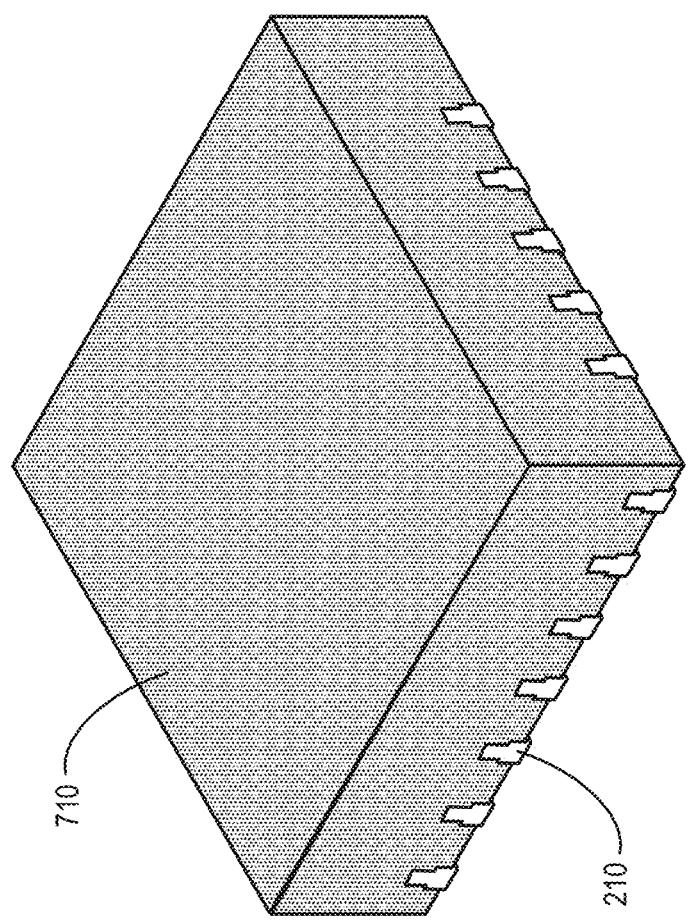
FIG. 7 illustrates a top perspective view of a semiconductor package according to some embodiments of the invention.
Figure 8:
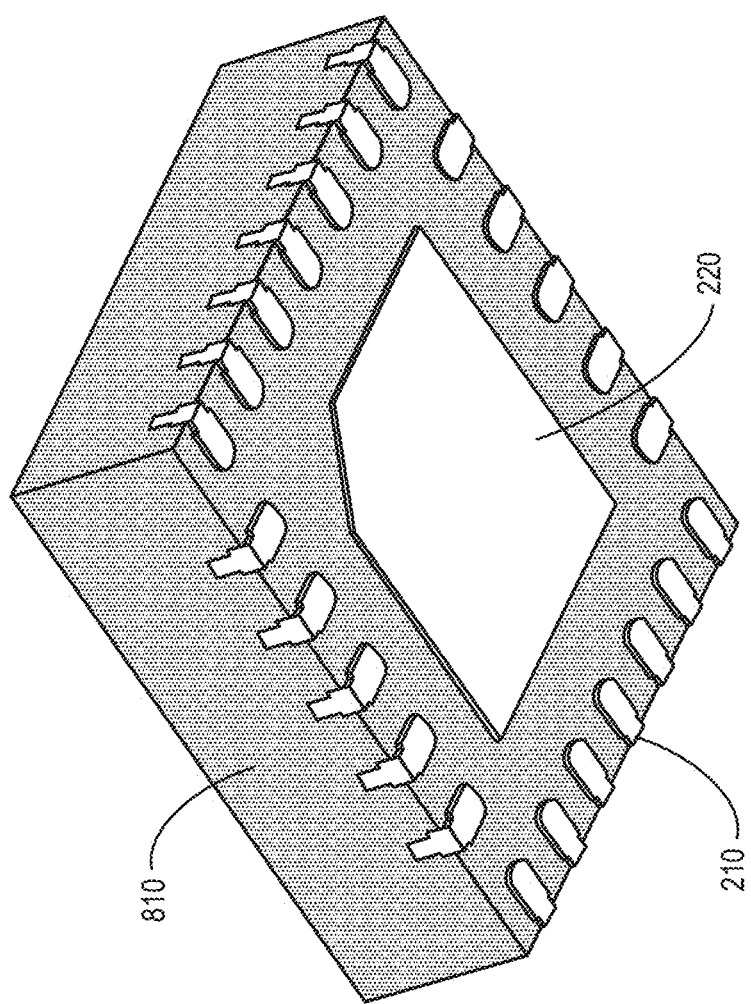
FIG. 8 illustrates a bottom perspective view of a semiconductor package according to some embodiments of the invention.

FIG. 2 also shows cutline 205, where, after the package is completed as shown in FIGS. 7 and 8, the connection portions 203 are cut off from the lead pads 210 to separate the lead pads 210 and the die attach pad 220 from the peripheral frame 201.

In some embodiments, leadframe 200 also includes multiple lead pads on the first side 2200-1 of the die attach pad 220, with two or more of the lead pads disposed on either side of the first lead pad. For example, as shown in FIG. 2, lead pads 210-11 and 210-12 are on the left side of the first lead pad 210-1. Further, lead pads 210-13 and 210-14 are on the right side of the first lead pad 210-1. Similarly, multiple lead pads are on the second side of the die attach pad, with two or more of the lead pads disposed on either side of the second lead pad. As shown in FIG. 2, lead pads 210-21 and 210-22 are on the left side of the first lead pad 210-2. Further, lead pads 210-23 and 210-24 are on the right side of the first lead pad 210-2.

Figure 11:
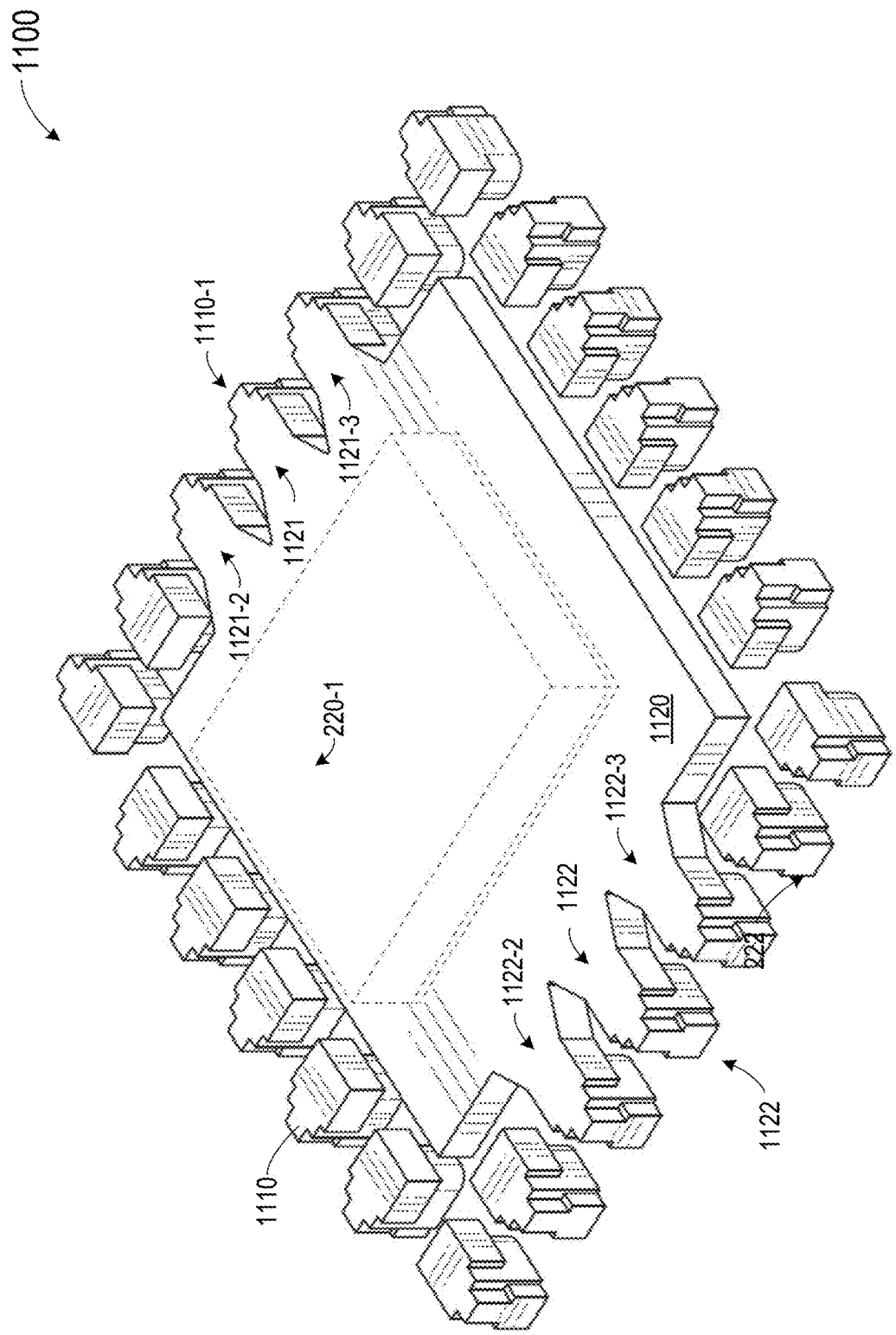
FIG. 11 illustrates a top perspective view of another leadframe after singulation according to some embodiments of the invention.
Figure 12:
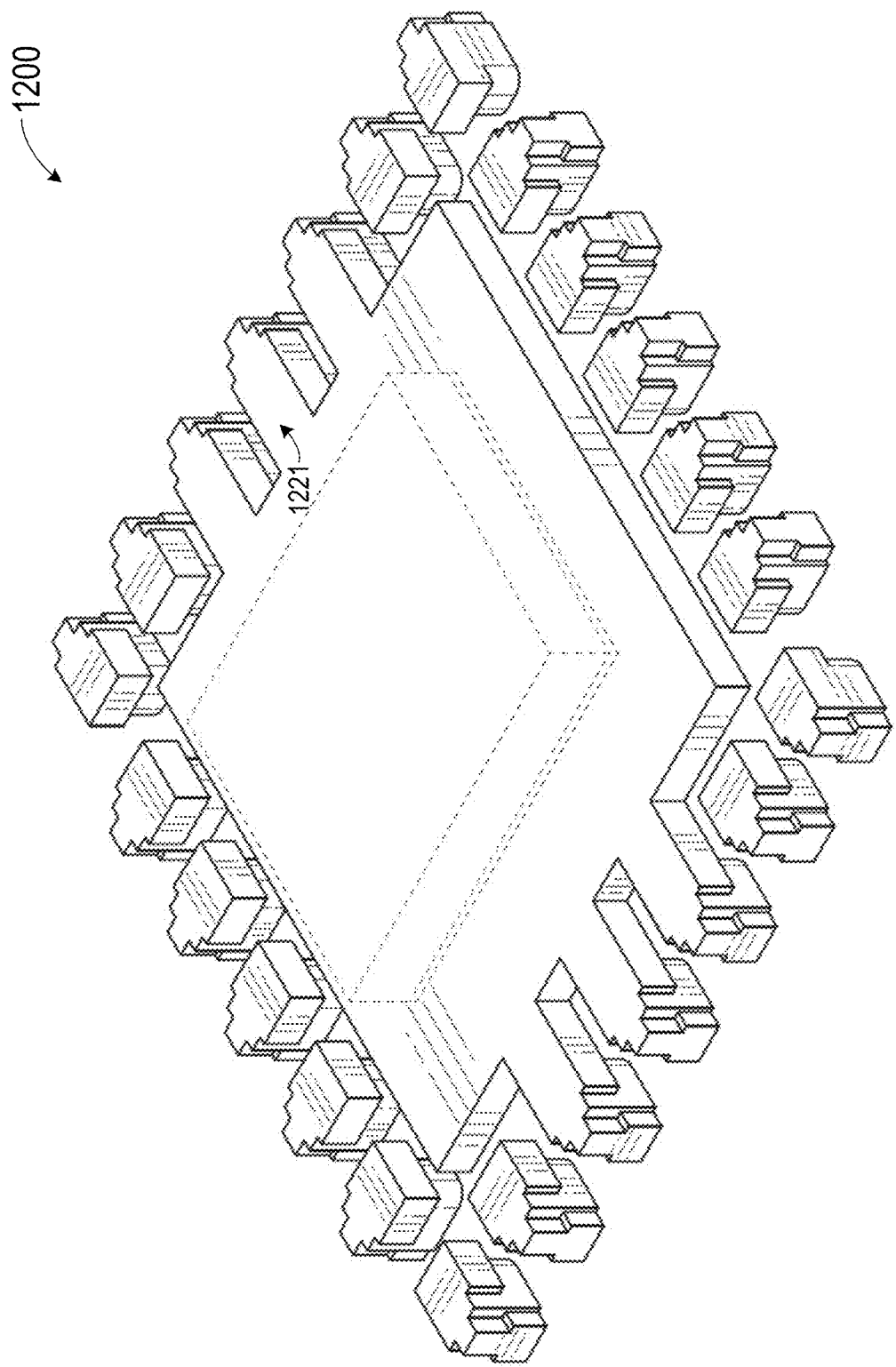
FIG. 12 illustrates a top perspective view of another leadframe after singulation according to some embodiments of the invention.

In some embodiments, the die attach pad also includes an additional protruding portion on either side of the first protruding portion, coupled to a respective lead pad on either side of the first lead pad. The die attach pad also includes an additional protruding portion on either side of the second protruding portion, coupled to a respective lead pad on either side of the second lead pad. Examples of these embodiments are shown in FIGS. 11 and 12, as described below.

Figure 13:
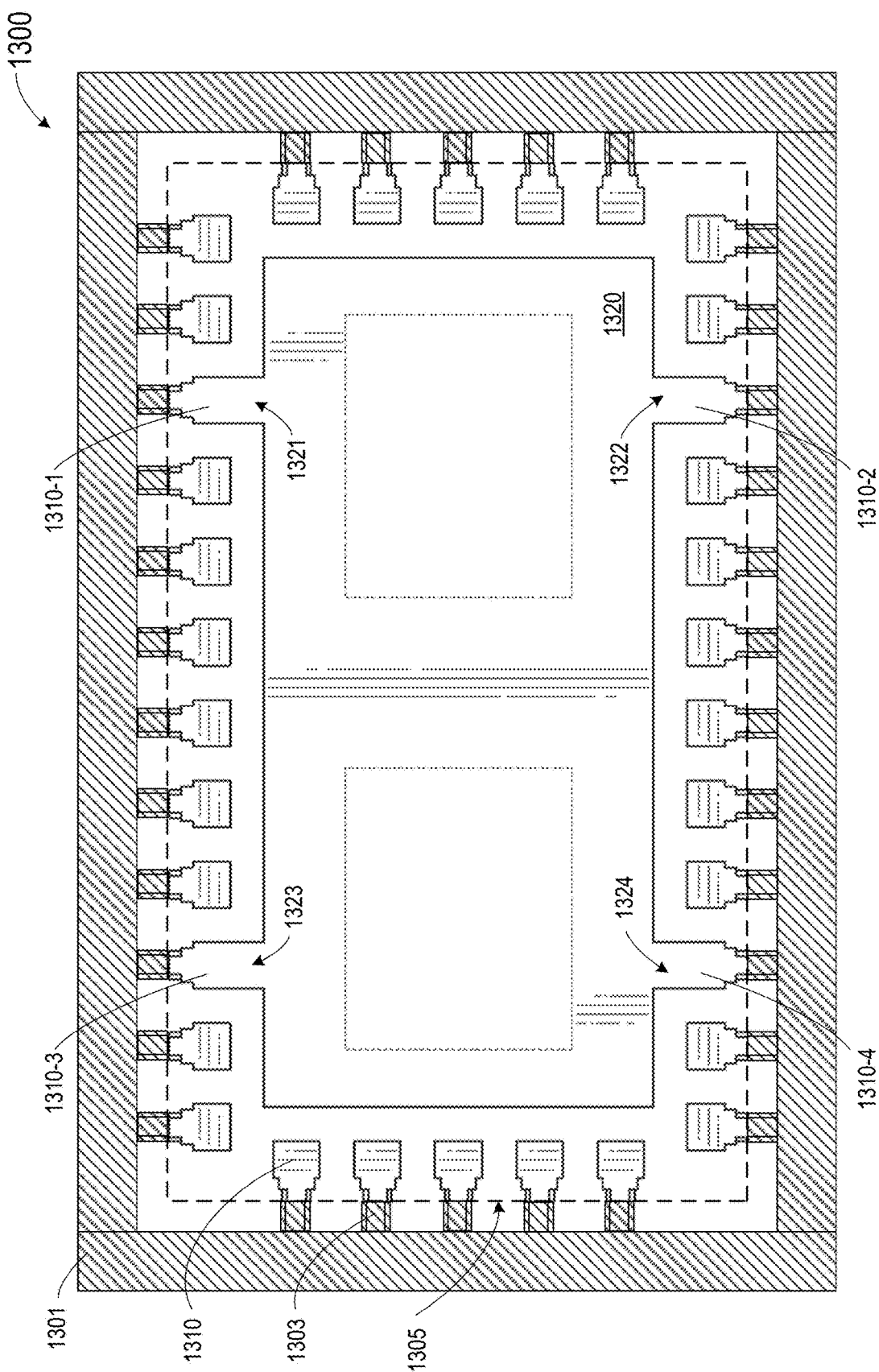
FIG. 13 is a simplified schematic diagram illustrating a top view of a leadframe according to some embodiments of the invention.
Figure 14:
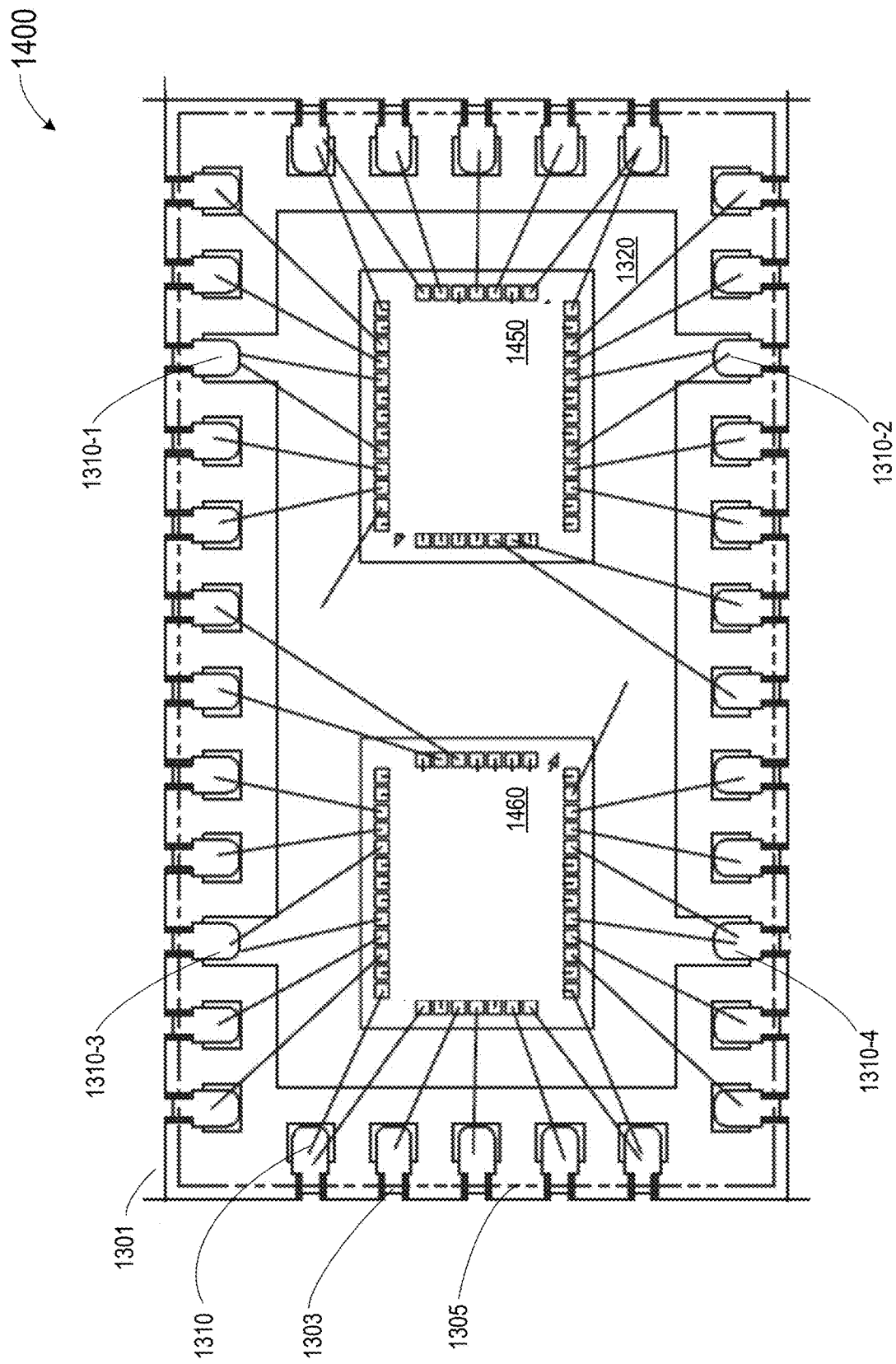
FIG. 14 is a simplified schematic diagram illustrating a top view of two semiconductor chips on a leadframe according to some embodiments of the invention.
Figure 15:
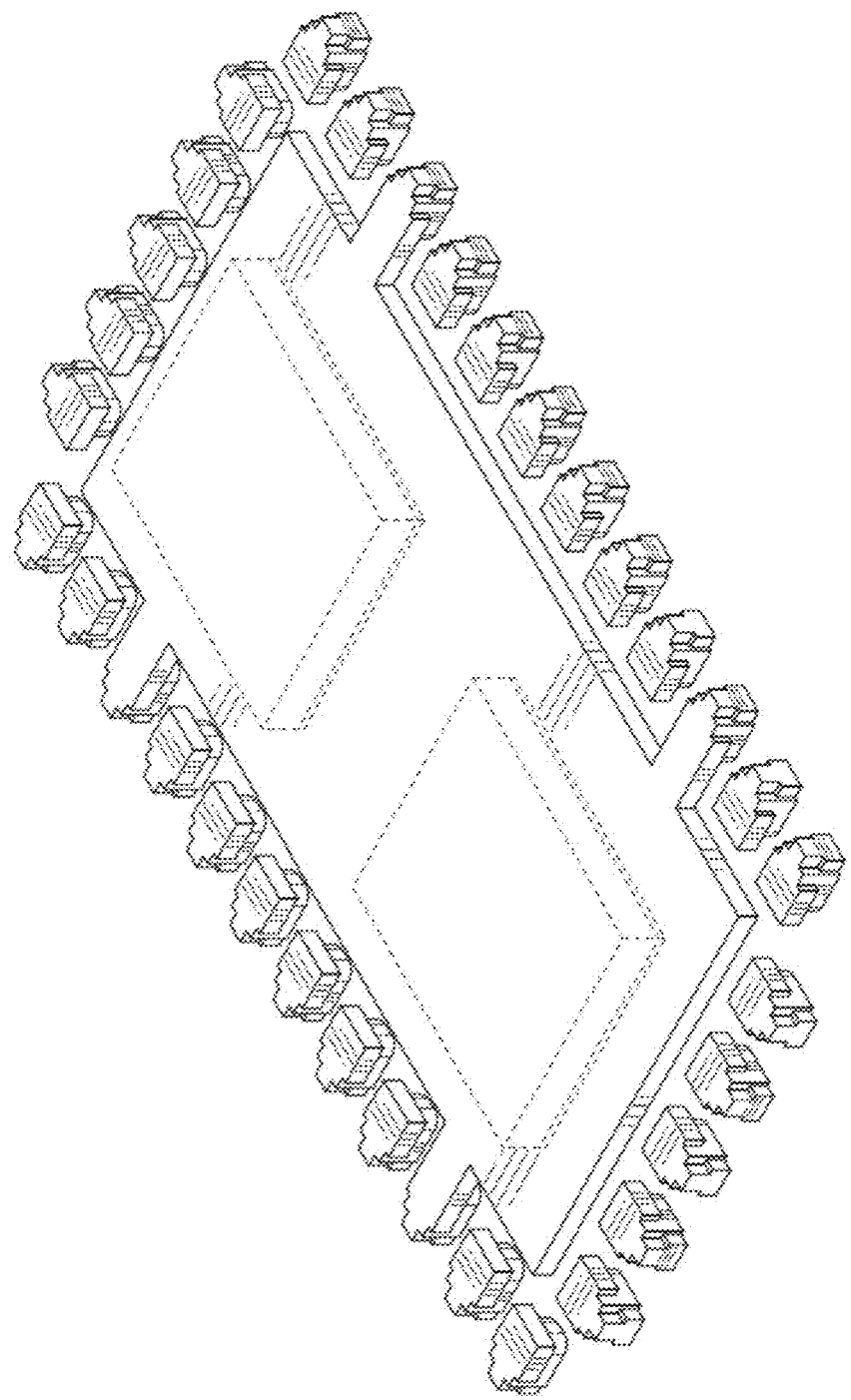
FIG. 15 illustrates a top perspective view of a leadframe after singulation according to some embodiments of the invention.

In some embodiments, the die attach pad is characterized by a rectangular shape having a length longer than a width. In these embodiments, the die attach pad also includes a third protruding portion on the first side of the die attach pad, the third protruding portion coupled to a third lead pad. The die attach pad also includes a fourth protruding portion on the second side of the die attach pad opposite the first side, the fourth protruding portion coupled to a fourth lead pad. Examples of these embodiments are shown in FIGS. 13 - 15, as described below.

In the embodiment shown in FIG. 2, the protruding portions 221 and 222 are characterized by slanted edges, for example, 225 and 226. In some embodiments, the protruding portions of the die attach pad are characterized by straight and parallel edges. In other embodiments, the protruding portions of the die attach pad are characterized by curved edges and can have different curvatures.

Figure 3:
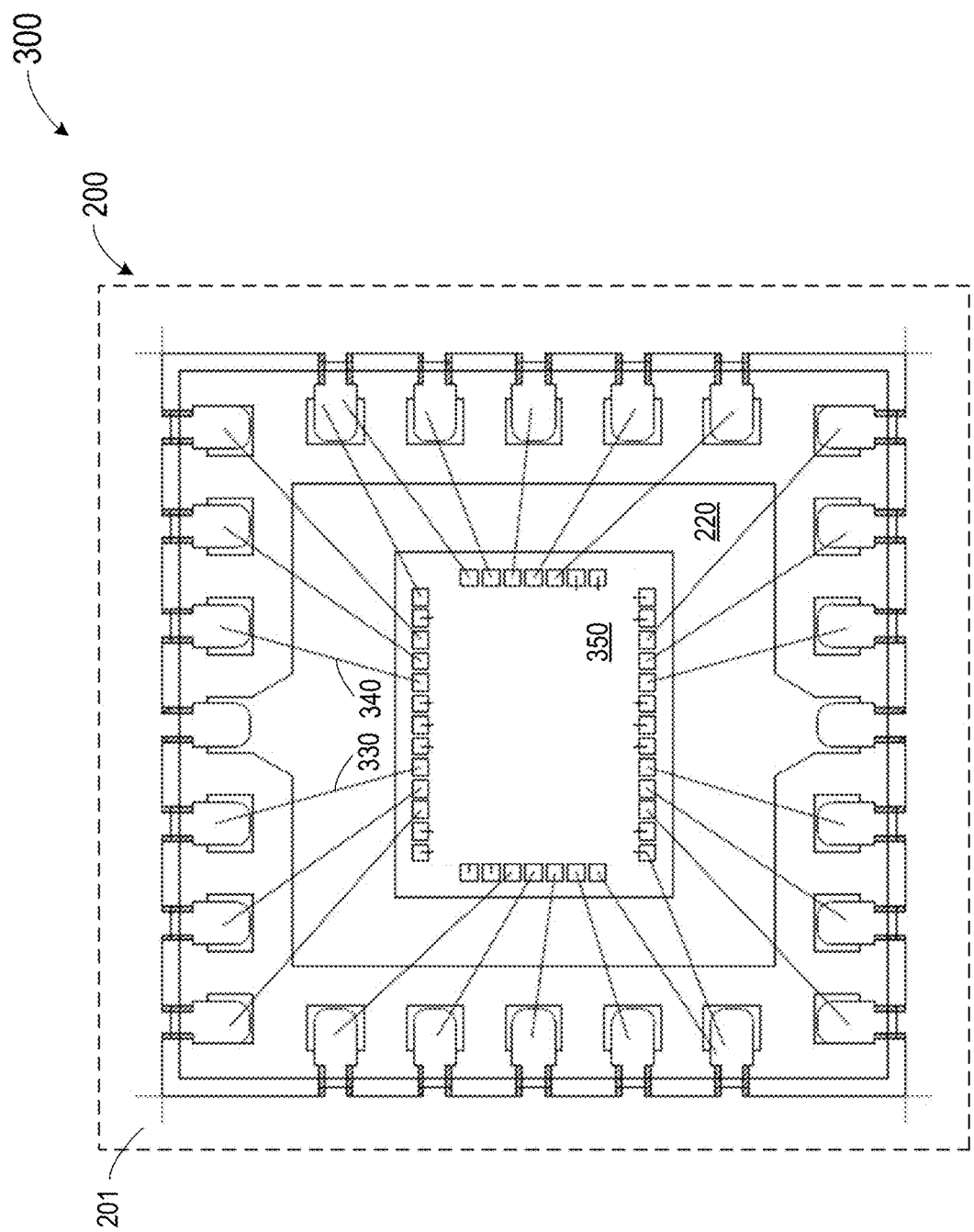
FIG. 3 is a simplified schematic diagram illustrating a top view of a semiconductor chip on a leadframe according to some embodiments of the invention.

FIG. 3 is a simplified schematic diagram illustrating a top view of a semiconductor package including a semiconductor chip on a leadframe according to some embodiments of the invention. As shown in FIG. 3, a semiconductor package 300 includes a leadframe 200 and semiconductor integrated circuit (IC) die 350, also referred to as an IC chip. Leadframe 200 in FIG. 3 is similar to leadframe 200 described above in connection to FIG. 2, and the same reference numerals are used in the description. As shown in FIGS. 2 and 3, a leadframe 200 includes a peripheral frame and a plurality of lead pads 210. Each of the plurality of lead pads 210 is physically connected to the peripheral frame 201 by a respective connecting portion 203. Leadframe 200 also has a die attach pad 220 configured for mounting a semiconductor integrated circuit (IC) chip. The die attach pad 220 is surrounded by the plurality of lead pads 210. The die attach pad 220 is characterized by a rectangular shape. The die attach pad 220 includes a first protruding portion 221 on a first side 220-1 of the die attach pad 220, that is coupled to a first lead pad 210-1. The die attach pad 220 also includes a second protruding portion 222 on a second side 220-2 of the die attach pad 220 opposite the first side. The second protruding portion 210-2 is coupled to a second lead pad 210-2. Otherwise, the die attach pad 220 does not comprise direct connections to the peripheral frame 201, without going through a lead pad 210.

FIGS. 2 and 3 also shows cutline 205, where, after the package is completed as shown in FIGS. 7 and 8, the connection portions 203 are cut off from the lead pads 210 to separate the lead pads 210 and the die attach pad 220 from the peripheral frame 201.

As shown, a die attach pad is surrounded by a plurality of lead pads, wherein the die attach pad is characterized by a rectangular shape. The die attach pad includes a first protruding portion on a first side of the die attach pad, the first protruding portion coupled to a first lead pad. Multiple lead pads on the first side of the die attach pad are aligned with the first lead pad, with two or more of the lead pads disposed on both sides of the first lead pad. The die attach pad also includes a second protruding portion on a second side of the die attach pad opposite the first side, the second protruding portion coupled to a second lead pad. Multiple lead pads on the second side of the die attach pad are aligned with the second lead pad, with two or more of the lead pads disposed on both sides of the second lead pad.

As shown in FIG. 3, a semiconductor integrated circuit (IC) die 350 is attached to the die attach pad 220 of the leadframe 200. In some embodiments, the die attach pad provides electrical ground for the first lead pad and the second lead pad. Semiconductor package 300 also includes bonding wires 330 coupling bonding pads for active signals on the IC die to lead pads on the first side of the die attach pad that are not coupled to the die attach pad and bonding wires 340 coupling bonding pads for active signals on the IC die to lead pads on the second side of the die attach pad that are not coupled to the die attach pad.

In some embodiments, the active signals include control and data signals. The grounding of the first lead pad and the second lead pad between active electrical signals can provide shielding and reduce cross talk and interference.

In some embodiments, electrical grounding for the semiconductor IC die can be provided either through conductive die attach material or by bonding wires coupling the first lead pad and the second lead pad to ground bonding pads on the IC die.

As shown in FIGS. 2 and 3, the leadframe includes peripheral frame 201 connected to the plurality of lead pads 210. The die attach pad is coupled to the peripheral frame through the first lead pad 210-1 and the second lead pad 210-2. However, the die attach pad does not have a direct connection to the peripheral frame. In this embodiment, the first lead pad 210-1 and the second lead pad 210-2 provide sufficient mechanical connection between the die attach pad and the peripheral frame. An additional advantage of this design is that it simplifies that lead frame design and manufacturing.

Figure 4:
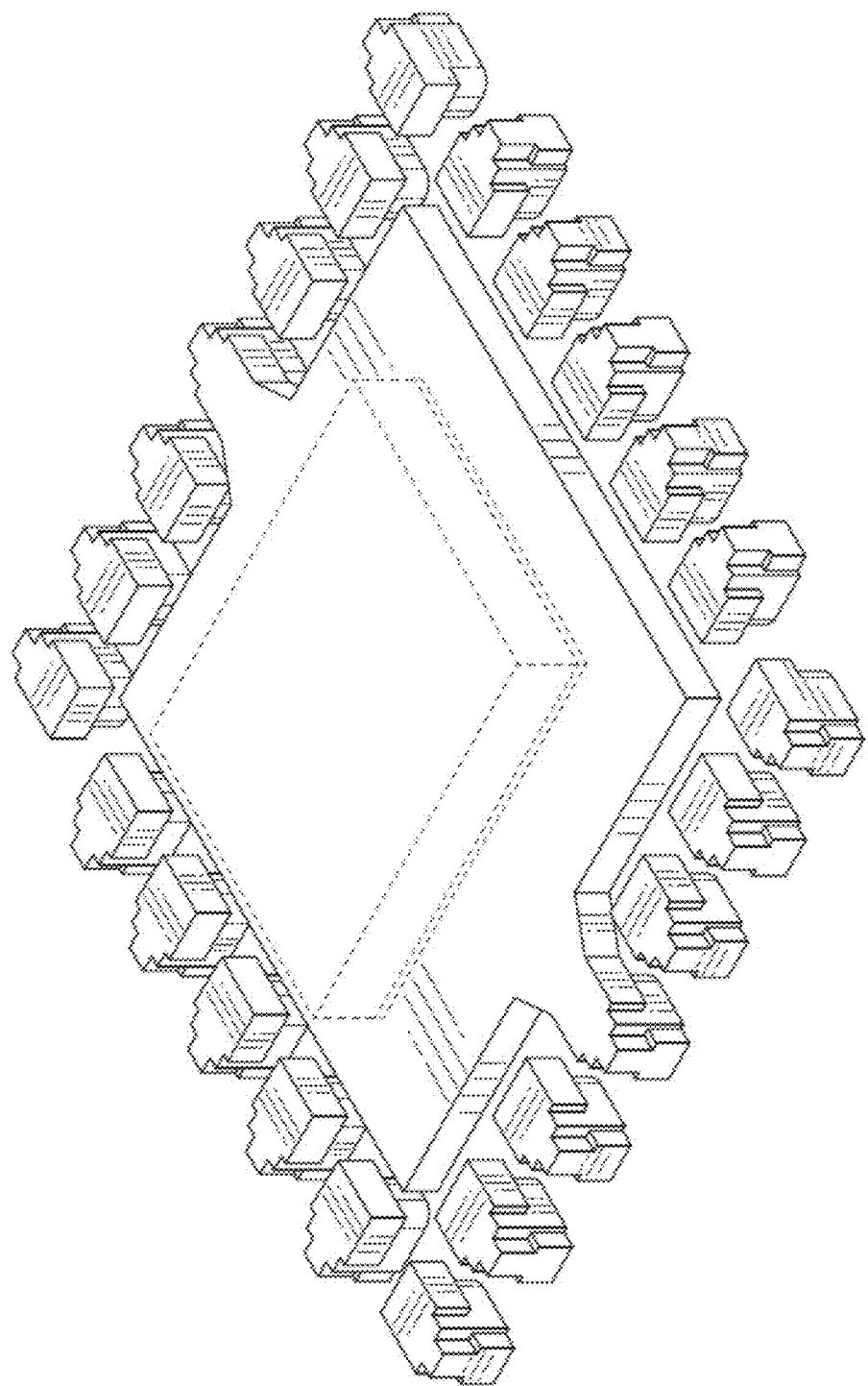
FIG. 4 illustrates a top perspective view of a leadframe after singulation according to some embodiments of the invention.

FIG. 4 illustrates a top perspective view of a leadframe after singulation according to some embodiments of the invention. FIG. 4 shows a top perspective view of a leadframe 400, which is an example of leadframe 200 in FIG. 2 after the peripheral frame 201 is removed at the cutline 205.

Figure 5:
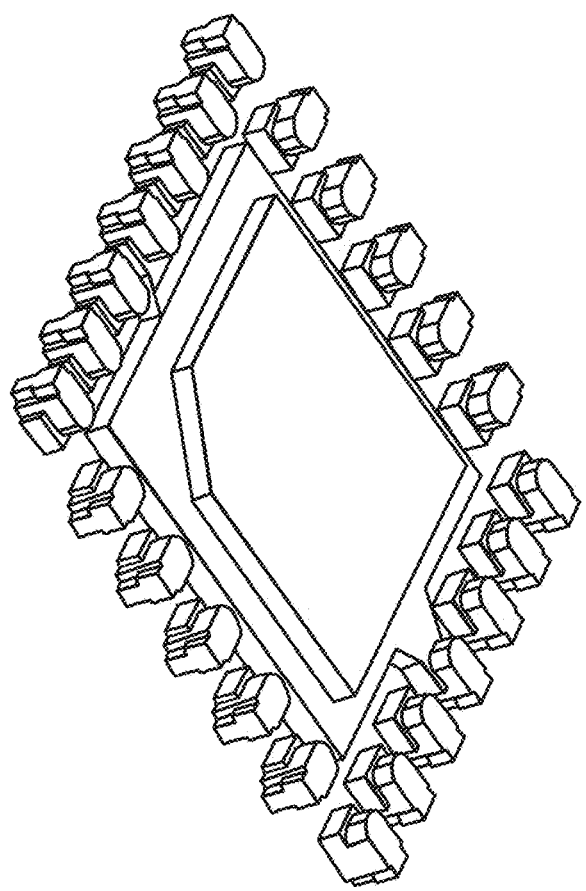
FIG. 5 illustrates a bottom perspective view of a leadframe after singulation according to some embodiments of the invention.

FIG. 5 illustrates a bottom perspective view of a leadframe after singulation according to some embodiments of the invention. FIG. 5 shows a bottom perspective view of a leadframe 500, which is an example of leadframe 200 in FIG. 2 after the peripheral frame 201 is removed at the cutline 205.

Figure 6:
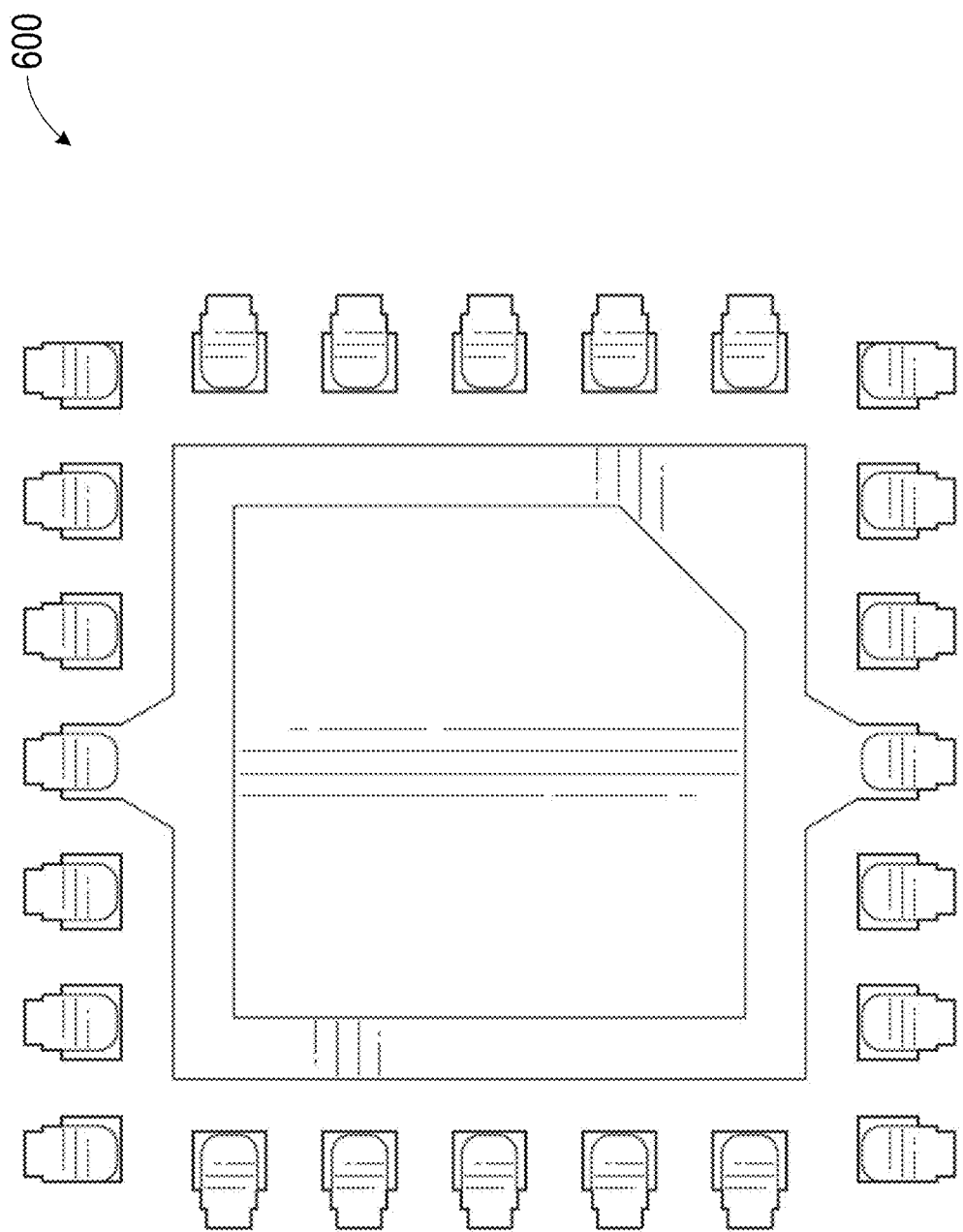
FIG. 6 illustrates a bottom plan view of a leadframe after singulation according to some embodiments of the invention.

FIG. 6 illustrates a bottom plan view of a leadframe after singulation according to some embodiments of the invention. FIG. 6 shows a bottom plan view of a leadframe 600, which is an example of leadframe 200 in FIG. 2 after the peripheral frame 201 is removed at the cutline 205.

FIG. 7 illustrates a top perspective view of a semiconductor package according to some embodiments of the invention. FIG. 7 shows a top perspective view of a semiconductor package 700 with a molding 710 covering the semiconductor IC chip and the leadframe after singulation. The side edges of lead pads 210 are visible from outside the package.

FIG. 8 illustrates a bottom perspective view of a semiconductor package according to some embodiments of the invention. FIG. 8 shows a bottom perspective view of a semiconductor package 800 with a molding 810 covering the semiconductor IC chip and the leadframe after singulation. The side and bottom edges of lead pads 210 and the bottom surface of the die attach pad 220 are visible from outside the package.

Figure 9:
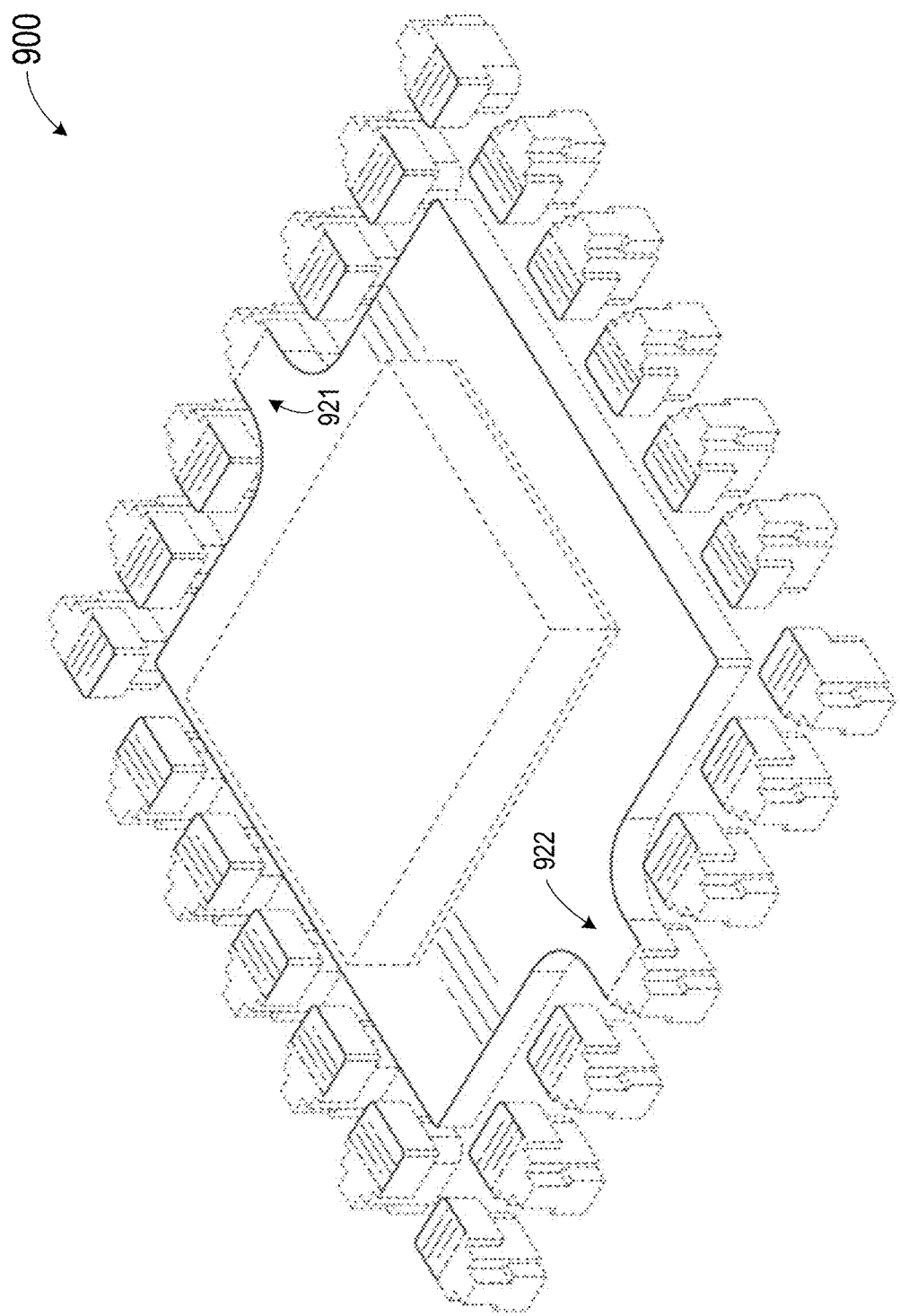
FIG. 9 illustrates a top perspective view of another leadframe after singulation according to some embodiments of the invention.

FIG. 9 illustrates a top perspective view of another leadframe after singulation according to some embodiments of the invention. FIG. 9 shows a top perspective view of a leadframe 900, which is similar to leadframe 400 in FIG. 4. However, the die attach pad extensions 921 and 922 in leadframe 900 are characterized by a curved shape. In contrast, the die attach pad extensions in leadframe 400 (and die attach pad extensions 221 and 222) are characterized by a slanted line shape.

Figure 10:
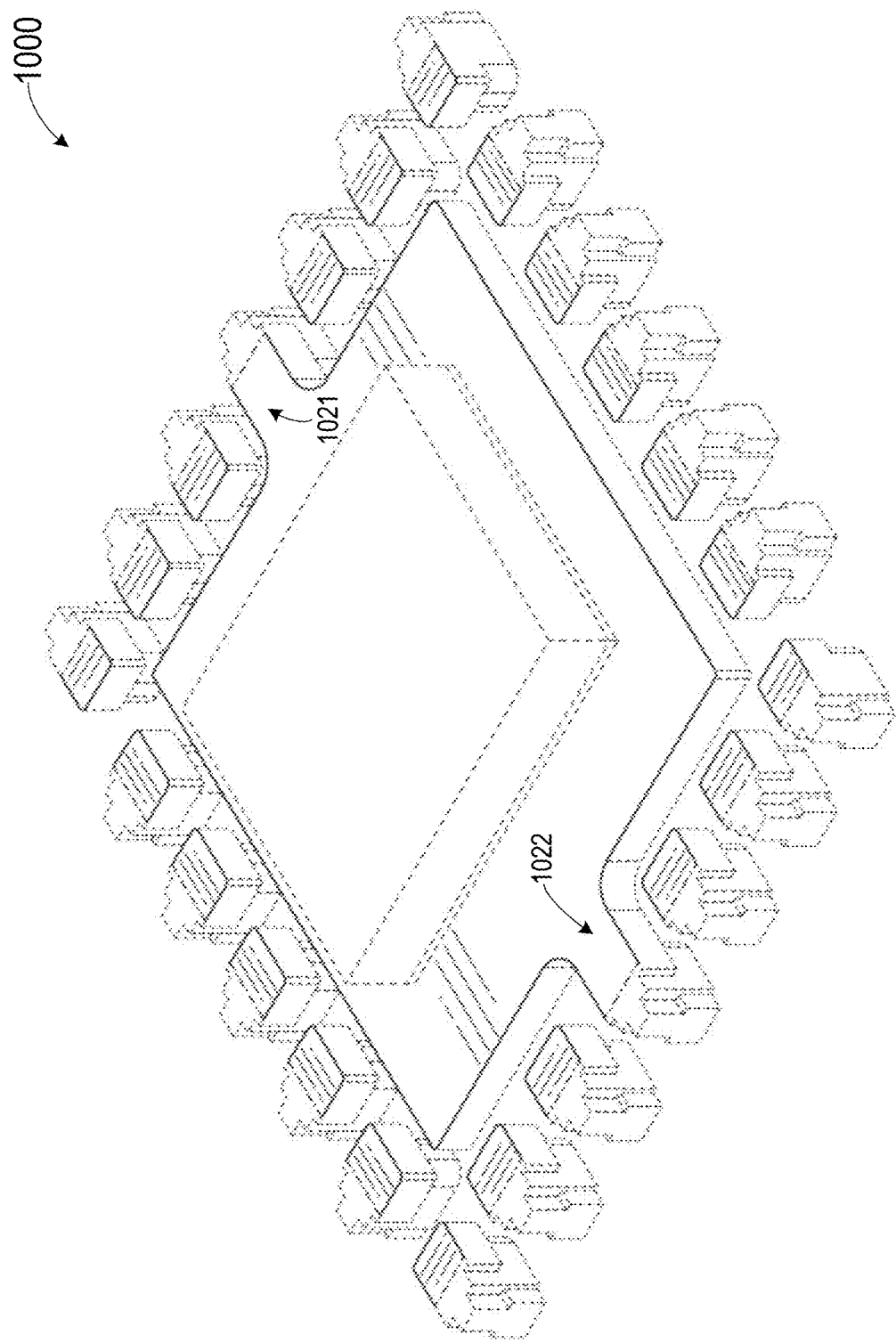
FIG. 10 illustrates a top perspective view of another leadframe after singulation according to some embodiments of the invention.

FIG. 10 illustrates a top perspective view of another leadframe after singulation according to some embodiments of the invention. FIG. 10 shows a top perspective view of a leadframe 1000, which is similar to leadframe 900 in FIG. 9. However, the die attach pad extensions 1021 and 1022 in leadframe 1000 are also characterized by a curved shape with a smaller radius of curvature than die attach pad extensions 921 and 922 in leadframe 900. It is noted that, depending on the embodiments, the die attach pad extensions can also have other shapes. For example, die attach pad extensions 1221 and 1222 of leadframe 1200 shown below in FIG. 12 are characterized by straight parallel edges.

In some embodiments, the die attach pad also includes an additional protruding portion on either side of the first protruding portion, coupled to a respective lead pad on either side of the first lead pad. The die attach pad also includes an additional protruding portion on either side of the second protruding portion, coupled to a respective lead pad on either side of the second lead pad. Examples of these embodiments are shown in FIGS. 12 and 13, as explained below.

FIG. 11 illustrates a top perspective view of another leadframe after singulation according to some embodiments of the invention. In FIG. 11, leadframe 11 includes a plurality of lead pads 1110, each of the plurality of lead pads physically connected to a peripheral frame by a respective connecting portion (not shown, after singulation). A die attach pad 1120 is configured for mounting a semiconductor integrated circuit (IC) chip, the die attach pad being surrounded by the plurality of lead pads 1110. The die attach pad 1120 includes a first protruding portion 1121 on a first side of the die attach pad, the first protruding portion coupled to a first lead pad 1110-1. The die attach pad 1120 also includes a second protruding portion 1122 on a second side of the die attach pad opposite the first side, the second protruding portion 1122 coupled to a second lead pad 1110-2. The die attach pad does not comprise direct connections to the peripheral frame.

In the embodiment of FIG. 11, the die attach pad 1120 also includes an additional protruding portion, 1121-2 and 1121-3, respectively, on either side of the first protruding portion 1121, coupled to a respective lead pad on either side of the first lead pad 1121. The die attach pad 1120 also includes an additional protruding portion, 1122-2 and 1122-3, respectively, on either side of the second protruding portion 1122, coupled to a respective lead pad on either side of the second lead pad 1122.

FIG. 12 illustrates a top perspective view of another leadframe after singulation according to some embodiments of the invention. FIG. 12 illustrates a leadframe 1200 that is similar to leadframe 1100 in FIG. 11. One difference is that the die attach pad extension in FIG. 11, e.g., 1121, is characterized by slanted edges, whereas the die attach pad extension in FIG. 12, e.g., 1221, is characterized by straight and parallel edges. In some other embodiments, the die attach pads have curved edges, and the curved edges can have different curvatures.

In some embodiments, the die attach pad 1120 is characterized by a rectangular shape having a length longer than a width and is configured to mount two or more semiconductor IC chips. Some examples are illustrated in FIGS. 11-17.

FIG. 13 is a simplified schematic diagram illustrating a top view of a leadframe according to some embodiments of the invention. As illustrated in FIG. 13, a leadframe 1300 includes a peripheral frame 1301, a plurality of lead pads 1310, and a die attach pad 1320. Each of the plurality of lead pads is physically connected to the peripheral frame by a respective connecting portion 1303. The die attach pad 1320 is configured for mounting a semiconductor integrated circuit (IC) chip, and the die attach pad is surrounded by the plurality of lead pads. The die attach pad is characterized by a rectangular shape, with a length greater than a width. The die attach pad 1320 includes a first protruding portion 1321 on a first side of the die attach pad 1320, that is coupled to a first lead pad 1310-1. The die attach pad 1320 also includes a second protruding portion 1322 on a second side of the die attach pad 1320 opposite the first side. The second protruding portion 1322 is coupled to a second lead pad 1310-2. Otherwise, the die attach pad 220 does not comprise direct connections to the peripheral frame 1301, without going through a lead pad 1310.

FIG. 13 also shows cut line 1305, where, after the package is completed as shown in FIGS. 7 and 8, the connection portions 1303 are cut off from the lead pads 1310 to separate the lead pads 1310 and the die attach pad 1320 from the peripheral frame 1301.

Leadframe 1300 also includes a third protruding portion 1323 on the first side of the die attach pad, the third protruding portion 1323 coupled to a third lead pad 1310-3. Leadframe 1300 also includes a fourth protruding portion 1324 on the second side of the die attach pad opposite the first side, the fourth protruding portion 1324 coupled to a fourth lead pad 1310-4.

Leadframe 1300 also has other features similar to those in leadframe 200 in FIG. 2. For example, leadframe 1300 further includes multiple lead pads on the first side of the die attach pad, with two or more of the lead pads disposed on either side of the first lead pad; and multiple lead pads on the second side of the die attach pad, with two or more of the lead pads disposed on either side of the second lead pad.

FIG. 14 is a simplified schematic diagram illustrating a top view of a semiconductor package including two semiconductor chips on a leadframe according to some embodiments of the invention. As shown in FIG. 14, semiconductor package 1400 includes a leadframe similar to leadframe 1300 in FIG. 13, and corresponding features are labeled with the same reference numerals. Semiconductor package 1400 includes first and second semiconductor integrated circuit (IC) dies 1450 and 1460 attached to die attach pad 1320.

In some embodiments, the die attach pad provides electrical ground for the first, second, third, and fourth lead pads. Semiconductor package 1400 also includes bonding wires coupling the bonding pads for active signals on the IC die to lead pads on the first side of the die attach pad that are not coupled to the die attach pad and bonding wires coupling bonding pads for active signals on the IC die to lead pads on the second side of the die attach pad that are not coupled to the die attach pad.

In some embodiments, the active signals include control and data signals. The grounding of the first lead pad and the second lead pad between active electrical signals can provide shielding and reduce cross talk and interference.

In some embodiments, electrical grounding for the semiconductor IC die can be provided either through conductive die attach material or by bonding wires coupling the first lead pad and the second lead pad to ground bonding pads on the IC die.

As shown in FIGS. 13 and 14, the leadframe includes peripheral frame 1301 connected to the plurality of lead pads 1310. The die attach pad is coupled to the peripheral frame through the first to fourth lead pads 1310-1, 1310-2, 1310-3, and 1310-4, but does not have a direct connection to the peripheral frame. In this embodiment, the first to fourth lead pads 1310-1, 1310-2, 1310-3, and 1310-4, provide sufficient mechanical connection between the die attach pad and the peripheral frame. An additional advantage of this design is that it simplifies that lead frame design and manufacturing.

FIG. 15 illustrates a top perspective view of a leadframe after singulation according to some embodiments of the invention. FIG. 15 shows a top perspective view of a leadframe 1500, which is an example of leadframe 1300 in FIG. 13 after the peripheral frame 1301 is removed at the cutline 1305.

Figure 16:
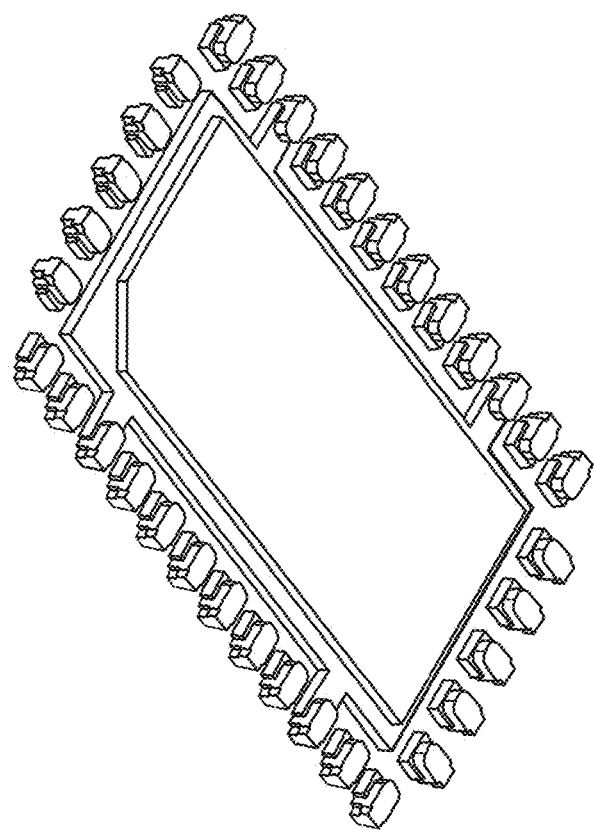
FIG. 16 illustrates a bottom perspective view of a leadframe after singulation according to some embodiments of the invention.

FIG. 16 illustrates a bottom perspective view of a leadframe after singulation according to some embodiments of the invention. FIG. 16 shows a bottom perspective view of a leadframe 1600, which is an example of leadframe 1300 in FIG. 13 after the peripheral frame 1301 is removed at the cutline 1305.

Figure 17:
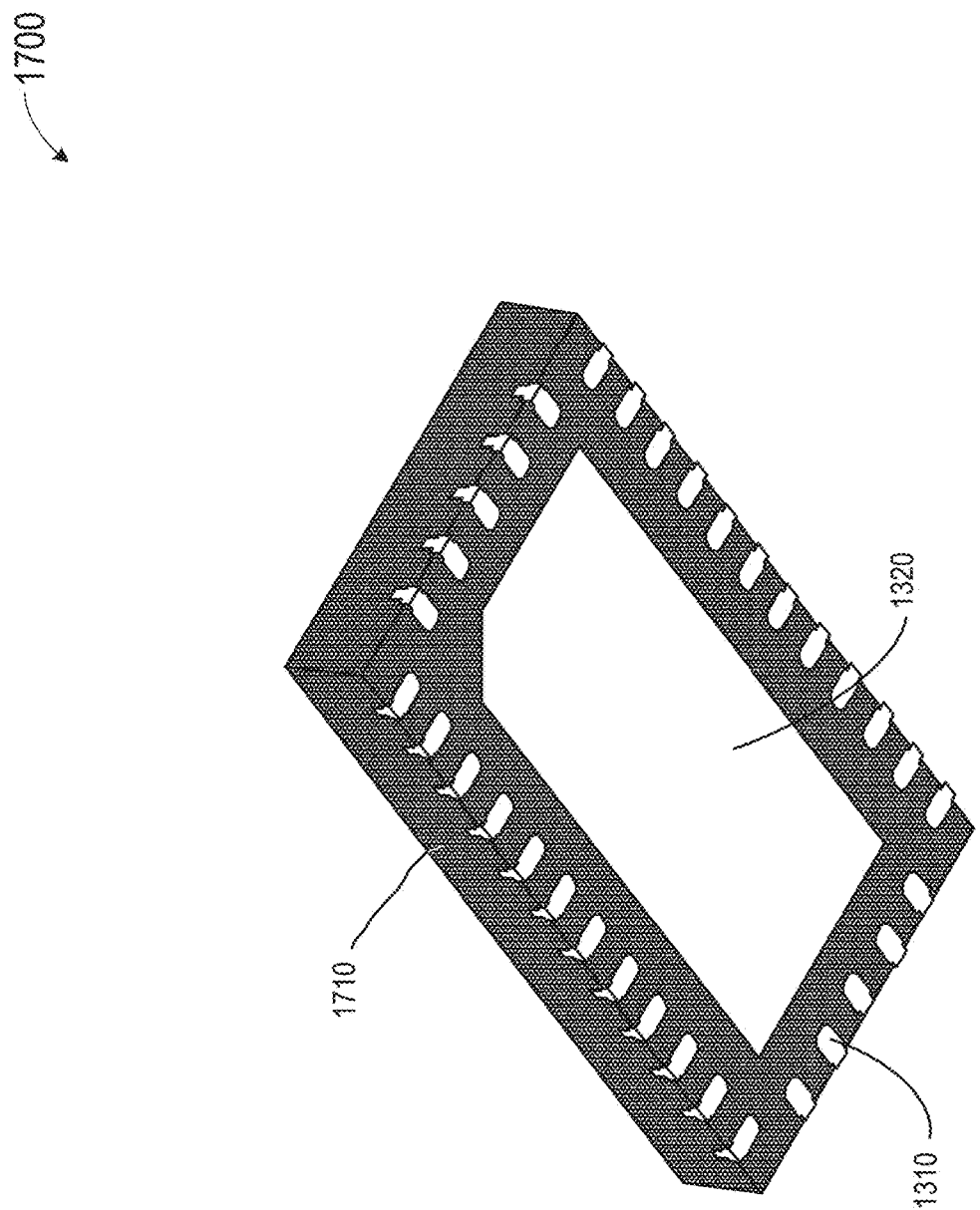
FIG. 17 illustrates a bottom perspective view of a semiconductor package according to some embodiments of the invention.

FIG. 17 illustrates a bottom perspective view of a semiconductor package according to some embodiments of the invention. FIG. 17 shows a bottom perspective view of a semiconductor package 1700 with a molding 1710 covering the semiconductor IC chip and the leadframe after singulation. The side and bottom edges of lead pads 1310 and the bottom surface of the die attach pad are visible from outside the package.

Figure 18:
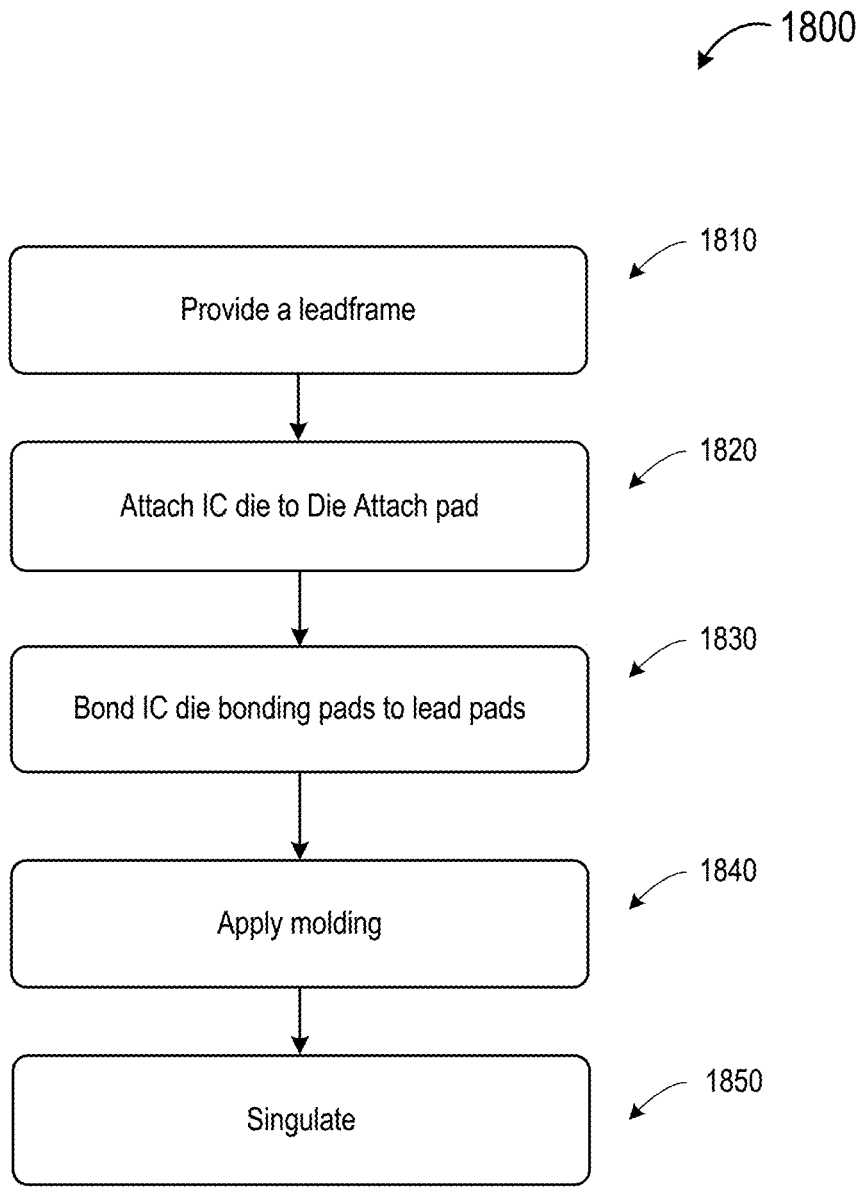
FIG. 18 is a simplified flowchart illustrating a method for operating an output driver according to some embodiments of the invention.

FIG. 18 is a simplified flowchart illustrating a method for forming a semiconductor package according to some embodiments of the invention. The flowchart in FIG. 18 describes a method 1800 for forming a semiconductor package, which is summarized here and further described below.

1810—providing a leadframe;
1820—attaching a first semiconductor integrated circuit (IC) die to the die attach pad;
1830—bonding IC die bonding pads for active signals to lead pads;
1840—applying a molding that covers portions of the leadframe, the die attach material, and the die; and
1850—singulating the dies.

At 1810, the method includes providing a leadframe. In some embodiments, the leadframes can be formed in an array or a strip. For example, a sheet of alloy, such as a copper alloy, is patterned using an etching process or a stamping process. It may include an additional etching process and may be followed by a plating process for the plurality of leadframes.

In some embodiments, the lead frame includes a peripheral frame, a plurality of lead pads, and a die attach pad. Each of the plurality of lead pads is physically connected to the peripheral frame by a respective connecting portion. The die attach pad is configured for mounting a semiconductor integrated circuit (IC) chip. The die attach pad is surrounded by the plurality of lead pads. The die attach pad does not comprise direct connections to the peripheral frame. The die attach pad includes a first protruding portion on a first side of the die attach pad, the first protruding portion coupled to a first lead pad, and a second protruding portion on a second side of the die attach pad opposite the first side, the second protruding portion coupled to a second lead pad. Examples of the leadframe are described above in connections with FIGS. 1-17.

At 1820, the method includes attaching a first semiconductor integrated circuit (IC) die to the die attach pad. In some embodiments, the semiconductor die is attached to a die attach pad by depositing a die-attach epoxy on each of the die attach pads, placing the semiconductor die on the epoxy, and then curing the epoxy.

At 1830, the method includes bonding the IC die bonding pads for active signals to the lead pads on the first side of the die attach pad that are not coupled to the die attach pad. The method further includes bonding IC die bonding pads for active signals to lead pads on the second side of the die attach pad that are not coupled to the die attach pad. The semiconductor die is attached to the lead pads via wire bonds or other bonding methods.

At 1840, the method includes applying a molding that covers portions of the leadframe, the die attach material, and the die. For example, a molding compound is applied to cover the semiconductor die and other components with respect to each of the leadframes.

At 1850, the method includes separating the plurality of lead pads from the peripheral frame by cutting off the connecting portions between the lead pads and the peripheral frame. In some embodiments, the plurality of encapsulated leadframes in the array or strip of leadframes are marked and singulated into respective packages. Each of the packages are then tested.

In some embodiments of method 1800, the leadframe also includes multiple lead pads on the first side of the die attach pad, with two or more of the lead pads disposed on either side of the first lead pad; and multiple lead pads on the second side of the die attach pad, with two or more of the lead pads disposed on either side of the second lead pad.

In some embodiments, the die attach pad also includes an additional protruding portion on either side of the first protruding portion, coupled to a respective lead pad on either side of the first lead pad; and an additional protruding portion on either side of the second protruding portion, coupled to a respective lead pad on either side of the second lead pad.

In some embodiments, the die attach pad is characterized by a rectangular shape having a length longer than a width. The die attach pad further includes a third protruding portion on the first side of the die attach pad, the third protruding portion coupled to a third lead pad; and a fourth protruding portion on the second side of the die attach pad opposite the first side, the fourth protruding portion coupled to a fourth lead pad.

In some embodiments, the protruding portions of the die attach pad are characterized by straight edges.

In some embodiments, the protruding portions of the die attach pad are characterized by curved edges.

The features of several embodiments are described above to highlight some aspects of the present disclosure. It is understood that the examples and embodiments described herein are for illustrative purposes only and that various modifications or changes in light thereof will be suggested to persons skilled in the art and are to be included within the spirit and purview of this disclosure.

What is claimed is:

1. A semiconductor package, comprising:
  a leadframe including a die attach pad surrounded by a plurality of lead pads, wherein the die attach pad is characterized by a rectangular shape and comprises:
    a first protruding portion on a first side of the die attach pad, the first protruding portion coupled to a first lead pad;
    a first plurality of lead pads on the first side of the die attach pad aligned with the first lead pad, with two or more of the first plurality of lead pads disposed on both sides of the first lead pad;
    a second protruding portion on a second side of the die attach pad opposite the first side, the second protruding portion coupled to a second lead pad; and
    a second plurality of lead pads on the second side of the die attach pad aligned with the second lead pad, with two or more of the second plurality of lead pads disposed on both sides of the second lead pad;
  a semiconductor integrated circuit (IC) die attached to the die attach pad of the leadframe, wherein the die attach pad provides electrical ground connecting a plurality of directly adjacent ground bonding pads on the semiconductor IC die to the first lead pad and the second lead pad;
  a first plurality of bonding wires coupling bonding pads for active signals on the semiconductor IC die to the first plurality of lead pads on the first side of the die attach pad that are not coupled to the die attach pad; and
  a second plurality of bonding wires coupling bonding pads for active signals on the semiconductor IC die to the second plurality of lead pads on the second side of the die attach pad that are not coupled to the die attach pad.

2. The semiconductor package of claim 1, wherein the leadframe further comprises a peripheral frame connected to the first plurality of lead pads and the second plurality of lead pads, wherein the die attach pad does not comprise a direct connection to the peripheral frame.

3. The semiconductor package of claim 1, wherein the die attach pad further comprises:
  a first additional protruding portion on either side of the first protruding portion, coupled to a first respective lead pad on either side of the first lead pad; and
  a second additional protruding portion on either side of the second protruding portion, coupled to a second respective lead pad on either side of the second lead pad.

4. The semiconductor package of claim 1, wherein the die attach pad is characterized by a rectangular shape having a length longer than a width, the die attach pad further including:
  a third protruding portion on the first side of the die attach pad, the third protruding portion coupled to a third lead pad; and
  a fourth protruding portion on the second side of the die attach pad opposite the first side, the fourth protruding portion coupled to a fourth lead pad.

5. The semiconductor package of claim 4, wherein the semiconductor package further comprises:
  a second semiconductor integrated circuit (IC) die attached to the die attach pad of the leadframe;
  a third plurality of bonding wires coupling bonding pads for ground contact on the second semiconductor IC die to the third lead pad and the fourth lead pad, respectively;
  a fourth plurality of bonding wires coupling bonding pads for active signals on the second semiconductor IC die to the first plurality of lead pads on the first side of the die attach pad, with two or more of the first plurality of lead pads disposed on both sides of the third lead pad; and
  a fifth plurality of bonding wires coupling bonding pads for active signals on the second semiconductor IC die to the second plurality of lead pads on the second side of the die attach pad, with two or more of the second plurality of lead pads disposed on both sides of the fourth lead pad.

6. The semiconductor package of claim 1, wherein the first protruding portion and the second protruding portion of the die attach pad are characterized by straight edges.

7. The semiconductor package of claim 1, wherein the first protruding portion and the second protruding portion of the die attach pad are characterized by curved edges.

8. The semiconductor package of claim 1, further comprising a molding that covers portions of the leadframe, die attach material, and the semiconductor IC die, wherein a portion of the die attach pad, the first plurality of lead pads, and the second plurality of lead pads are exposed from the semiconductor package.

9. The semiconductor package of claim 1, wherein the active signals comprise control signals and data signals.

10. The semiconductor package of claim 1, wherein the first protruding portion and the second protruding portion of the die attach pad are characterized by straight edges.

11. A leadframe package, comprising:
a peripheral frame;
a plurality of lead pads, each of the plurality of lead pads physically connected to the peripheral frame by a respective connecting portion;
a die attach pad configured for mounting a semiconductor integrated circuit (IC) chip, the die attach pad being surrounded by the plurality of lead pads;
wherein the die attach pad is characterized by a rectangular shape and includes:
  a first protruding portion on a first side of the die attach pad, the first protruding portion coupled to a first lead pad; and
  a second protruding portion on a second side of the die attach pad opposite the first side, the second protruding portion coupled to a second lead pad, wherein the die attach pad does not comprise direct connections to the peripheral frame;
wherein the leadframe package further comprises:
  a first plurality of lead pads on the first side of the die attach pad, with two or more of the first plurality of lead pads disposed on either side of the first lead pad; and
  a second plurality of lead pads on the second side of the die attach pad, with two or more of the second plurality of lead pads disposed on either side of the second lead pad;
wherein the semiconductor IC die is attached to a first portion of the die attach pad, wherein the die attach pad provides electrical ground connecting a plurality of directly adjacent ground bonding pads on the semiconductor IC die to the first lead pad and the second lead pad;
a first plurality of bonding wires coupling bonding pads on the semiconductor IC die to the first plurality of lead pads on the first side of the die attach pad; and
a second plurality of bonding wires coupling bonding pads on the semiconductor IC die to the second plurality of lead pads on the second side of the die attach pad.

12. The leadframe of claim 11, wherein the die attach pad further comprises:
a first additional protruding portion on either side of the first protruding portion, coupled to a first respective lead pad on either side of the first lead pad; and
a second additional protruding portion on either side of the second protruding portion, coupled to a second respective lead pad on either side of the second lead pad.

13. The leadframe of claim 12, wherein the die attach pad is characterized by a rectangular shape having a length longer than a width, the die attach pad further including:
a third protruding portion on the first side of the die attach pad, the third protruding portion coupled to a third lead pad; and
a fourth protruding portion on the second side of the die attach pad opposite the first side, the fourth protruding portion coupled to a fourth lead pad.

14. The leadframe package of claim 11, wherein the first protruding portion and the second protruding portion of the die attach pad are characterized by straight edges.

15. The leadframe package of claim 11, wherein the first protruding portion and the second protruding portion of the die attach pad are characterized by curved edges.

16. The leadframe package of claim 11, wherein the die attach pad further comprises a second portion of the die attach pad operable to accommodate a second semiconductor IC die, and the second semiconductor IC die is attached to the second portion of the die attach pad.

17. The leadframe package of claim 16, wherein the first portion of the die attach pad and the second portion of the die attach pad are disposed laterally to each other.

18. The leadframe package of claim 16, wherein a first area of the first portion of the die attach pad is substantially identical to a second area of the second portion of the die attach pad.

* * * * *